United States Patent [19]

Miura et al.

[11] Patent Number: 5,662,755
[45] Date of Patent: Sep. 2, 1997

[54] METHOD OF MAKING MULTI-LAYERED CERAMIC SUBSTRATES

[75] Inventors: Kazuhiro Miura, Osaka; Yoshihiro Bessho, Higashiosaka; Satoru Yuhaku, Osaka; Yasuhiko Hakotani, Nishinmiya; Minehiro Itagaki, Moriguchi; Yoshifumi Nakamura, Neyagawa; Akihiko Miyoshi, Moriguchi, all of Japan

[73] Assignee: Matsushita Electric Industrial Co., Ltd., Japan

[21] Appl. No.: 526,312

[22] Filed: Sep. 11, 1995

Related U.S. Application Data

[63] Continuation of Ser. No. 176,079, Dec. 30, 1993, abandoned.

[30] Foreign Application Priority Data

Oct. 15, 1993 [JP] Japan .................... 5-257378

[51] Int. Cl.$^6$ .................... B32B 31/26; B32B 31/12
[52] U.S. Cl. .................... 156/89; 156/277; 427/96; 427/123; 427/126.1; 29/851
[58] Field of Search .................... 156/89, 277, 278, 156/297; 264/61, 65; 427/96, 123, 126.1, 126.2, 126.3; 174/250, 257; 29/851; 361/751

[56] References Cited

U.S. PATENT DOCUMENTS

| | | | |
|---|---|---|---|
| 4,409,261 | 10/1983 | Kuo | 252/512 X |
| 4,627,160 | 12/1986 | Herron et al. | 156/89 X |
| 4,753,694 | 6/1988 | Herron et al. . | |
| 4,799,983 | 1/1989 | Desai . | |
| 4,863,683 | 9/1989 | Nakatani et al. | 252/513 X |
| 5,015,314 | 5/1991 | Suzuki et al. | 264/61 X |
| 5,073,180 | 12/1991 | Farooq et al. | 156/89 X |
| 5,085,720 | 2/1992 | Mikeska et al. . | |
| 5,102,720 | 4/1992 | Raj . | |
| 5,130,067 | 7/1992 | Flaitz et al. . | |
| 5,147,484 | 9/1992 | Chance et al. | 264/61 X |
| 5,178,934 | 1/1993 | Kellerman . | |
| 5,216,207 | 6/1993 | Prabhu et al. . | |
| 5,407,473 | 4/1995 | Miura et al. . | |
| 5,456,778 | 10/1995 | Fukuta et al. | 156/89 |

FOREIGN PATENT DOCUMENTS

| | | |
|---|---|---|
| 0479219 | 4/1992 | European Pat. Off. . |
| 0479219A1 | 4/1992 | European Pat. Off. . |
| 60-246269 | 12/1985 | Japan . |
| 63-184388 | 7/1988 | Japan . |
| 2-230605 | 9/1990 | Japan . |
| 2-254791 | 10/1990 | Japan . |

*Primary Examiner*—Melvin Mayes
*Attorney, Agent, or Firm*—Wenderoth, Lind & Ponack

[57] ABSTRACT

A method of making a multi-layered ceramic substrate which includes the steps of laminating a desired number of green sheets each being made of glass ceramics containing at least an organic binder and a solvent and each having a pattern of electrodes formed thereon by the use of an electroconductive paste, to thereby provide a green sheet laminate. The electrodes on opposite surfaces or an entire surface layer of the green sheet laminate are subsequently printed with a paste comprising an inorganic component added with at least an organic binder containing a Zn composition. On each surface of the laminate printed with the paste of the Zn composition, a green sheet made of an inorganic composition incapable of being sintered at a temperature of crystallization of the glass ceramics is then laminated thereby providing a laminate plate which is subsequently fired. After the firing, both of the inorganic composition incapable of firing sintered and the Zn composition are removed from the opposite surfaces of the laminate. The paste of the Zn composition may contains a main component selected from the group consisting of Zn, ZnO, Zn(OH)$_2$, ZnAl$_2$O$_4$, and ZnCO$_3$.

11 Claims, 2 Drawing Sheets

METHOD OF MAKING MULTI-LAYERED CERAMIC SUBSTRATES

This application is a continuation of now abandoned application Ser. No. 08/176,079, filed Dec. 30, 1993 now abandoned.

BACKGROUND OF THE INVENTION 1. (Field of the Invention)

Method of Making Multi-layered Ceramic Substrates 2. (Description of the Prior Art)

The present invention relates a ceramic multi-layered wiring substrate and a method of making the same which is used for the support of one or more semiconductor LSI components and/or chips in electrically connected fashion.

SUMMARY OF THE INVENTION

Semiconductor LSI (Large Scale Integrated) components and chips are now manufactured light-weight and compact in size and, accordingly, demands now exist to manufacture wiring substrates for the support of those components and chips which are also light-weight and compact in size. Ceramic multi-layered substrates are considered promising in the field of electronics since a ceramic multi-layered substrate can accommodate a high-density wiring and can be made small in thickness.

An electroconductive composition used nowadays as a material for electrodes used on the ceramic multi-layered substrate is generally a paste comprising organic media in which electroconductive metal, inorganic oxide and powdery glass are dispersed. As a result of recent development of a low-temperature sintered glass ceramic multi-layered substrate, one or a mixture of gold, silver, copper and palladium has come to be used as an electroconductive material that can be used in association therewith. As compared with traditionally used tungsten, molybdenum and others, these metals have a relatively low electric resistance and equipments in which they can be used can be manufactured safely and at a reduced cost.

On the other hand, of these metals, gold, silver and palladium are expensive with their price susceptible to change according to the value in the market. In view of this, in place of these noble metals, base metals which are inexpensive and less susceptible to a change in value in the market have come to be used widely. Of these base metals, copper is known to have a relatively low specific resistance and, also, an excellent solder-wettability and, therefore, the use of copper as a material for electrodes is desired.

An exemplary manufacturing process in which copper is used on a low-temperature sintered multi-layered substrate will now be discussed. In the practice of the process, two methods are available in which copper electrodes are employed in an inner layer and an outermost layer. While copper is superior in respect of electric resistance, solder-wettability and cost, a difficulty is involved in the manufacture since the sintering is required to be performed under a neutral atmosphere full of nitrogen. In order for the copper electrodes to be employed in practice, the process is performed by forming a wiring pattern on a substrate by the use of a screen printing technique using a Cu paste, drying the printed wiring pattern on the substrate and sintering the substrate at a temperature (about 850° to 950° C.) lower than the melting point of copper and under a nitrogen-filled atmosphere which is effective to avoid oxidization of Cu and which has an oxygen partial pressure controlled to allow organic components of the Cu paste to be burned sufficiently. Where the substrate is to be multi-layered, it can be obtained by printing and sintering insulating layers under a similar condition. However, since a control of the sintering atmosphere to have a proper oxygen partial pressure cannot be achieved with no difficulty and since, where the substrate is desired to be multi-layered, sintering must be carried out each time the paste has been printed, there is a problem in that not only is the lead time prolonged, but also expensive equipment is required to thereby incur an increase in manufacturing cost. (See the Japanese Laid-open Patent Publication No. 57-53321).

In view of the foregoing, the Japanese Patent No. 5-1774496 discloses a method of making a ceramic multi-layered substrate in which cupric oxide (CuO) is employed and which employs three steps of binder burn-out, reduction and sintering. According to the method disclosed therein, the cupric oxide is used as a starting material for conductors, and the binder burn-out step is a heat-treatment which is carried out under an oxygen-enriched atmosphere relative to carbon and at a temperature sufficient to decompose an organic binder contained therein. This binder burn-out step is followed by a reducing step during which the cupric oxide is reduced to copper, which is in turn followed by the sintering step during which the substrate is sintered. In this way, control of the sintering atmosphere can be easily executed to provide a finely sintered product.

On the other hand, the ceramic multi-layered substrate is susceptible to shrinkage during the sintering process. This thermal shrinkage varies with material used for the substrate, the composition of a green sheet and the lot number of powders and therefore poses some problems in making the multi-layered substrate. In the first place, since the sintering of an inter-layer wiring is employed during the manufacture of the multi-layered substrate as hereinbefore described, no connection with the inner electrode is possible due to a shrinkage error in dimension with the patterned wiring on the outermost layer. As a result thereof, a portion having a surface area larger than necessary must be formed in the electrode on the outermost layer to accommodate an error resulting from the thermal shrinkage and, therefore, the resultant substrate cannot be used for a circuit requiring a high-density wiring. For this reason, a number of framed screens for use in printing the wiring on the outermost layer is required one for accommodating a possible shrinkage error, which screens are employed one at a time according to the degree of shrinkage. According to this method, since a number of the framed screens are required, the method is complicated and time-consuming.

In the second place, the multi-layered substrate according to this green sheet laminating method, the degree of shrinkage thereof varies between a widthwise direction and a lengthwise direction depending on the direction in which a film is formed on the green sheet, posing a problem in making the ceramic multi-layered substrate.

In order to minimize the shrinkage error, not only must the composition of the green sheet be controlled, but a difference in lot number of the powder and laminating conditions such as press pressure and temperature must also be carefully controlled. However, it is generally said that the error in degree of shrinkage is found to be ±0.5%.

This means a problem is found not only in the multi-layered substrate, but also in anything manufactured by sintering glass ceramics. The Japanese Laid-open Patent Publication No. 5-102666 therefore discloses a method comprising the steps of laminating a desired number of green sheets made of a low-temperature sintered glass ceramics and having an electrode pattern formed thereon, laminating on one or both sides of the laminated body a green sheet made of an inorganic composition which is not sintered at a sintering temperature of the glass ceramic low-temperature sintered substrate material, baking the resultant laminated assembly and removing the organic composition which has not been sintered. According to this method, the sintering of the substrate material takes place only in a direction across the thickness and, accordingly the substrate in which the degree of shrinkage in a planar direction is zero can be obtained thereby eliminating the above discussed problem.

Although since then the substrate in which no shrinkage in the planar direction occur has been manufactured, the method disclosed in the Japanese Laid-open Patent Publication No. 5-102666 still has some problems. More specifically, the fact that no shrinkage of the substrate in the planar direction take place renders the sintered electrode, hitherto made of the conventional paste composition for the electrode, to be porous and, therefore, an electrode paste suited for exclusive use with a glass ceramic substrate in which no shrinkage in the planar direction take place is required. According to the state of art, when this electrode paste is used on a surface layer of the multi-layered substrate and is sintered simultaneously with the substrate, the solder-wettability of the surface electrode after having been sintered tends to be adversely affected to such an extent that a problem will occur in mounting component parts on the resultant substrate. If the multi-layered substrate is, without using the co-firing, fired and, after the inorganic composition which cannot be sintered at a temperature at which the glass ceramic on the surface is crystallized has been removed, an electrode paste is printed on the surface layer and then fired, the process involves an increased number of manufacturing steps, resulting in an increase in cost to manufacture the multi-layered substrate. Therefore, a co-firing of the surface electrode capable of exhibiting a favorable solder-wettability has been desired. However, no electroconductive paste for use on a surface layer of the substrate of a kind in which no shrinkage in the planar direction exists while satisfying the foregoing requirements, has yet been made available.

For the reason discussed above, since the glass ceramic multi-layered substrate in which no shrinkage in the highly precise planar direction takes place is used, a method of co-firing a surface electrode capable of exhibiting a favorable solder-wettability is necessitated. The present invention is therefore intended to solve these problems.

SUMMARY OF THE INVENTION

In accordance with the present invention, there is provided a method of making a multi-layered ceramic substrate which comprises the steps of laminating a desired number of green sheets each being made of glass ceramics containing at least an organic binder and a solvent and each having a pattern of electrodes formed thereon by the use of an electroconductive paste, to thereby provide a green sheet laminate. The electrodes on opposite surfaces or an entire surface layer of the green sheet laminate are subsequently printed with a paste comprising an inorganic component added with at least an organic binder, said inorganic component comprising a Zn composition. On each surface of the laminate printed with the paste of the Zn composition, a green sheet made of an inorganic composition incapable of being sintered at a temperature of crystallization of the glass ceramics is then laminated thereby providing a laminate plate which is subsequently fired. After the firing, both of the inorganic composition incapable of being sintered and the Zn composition are removed from the opposite surfaces of the laminate.

The paste of the Zn composition may contains a main component selected from the group consisting of Zn, ZnO, $Zn(OH)_2$, $ZnAl_2O_4$, and $ZnCO_3$. In such case, the amount of Zn contained in the paste of the Zn composition is preferably not smaller than 50 wt % relative to the total amount of the paste.

With the foregoing substrate making method of the present invention, the solder-wettability of the co-fired surface electrodes on the glass ceramic multi-layered substrate in which no shrinkage in the planar direction take place can be favorably improved. More specifically, since during the firing of the multi-layered substrate no inorganic composition on the opposite surfaces thereof is sintered, any possible shrinkage of the glass ceramic substrate in the planar direction is suppressed. Also, crystallization of Zn and Si contained in glass on the surface of each surface electrode results in a minimization of the glass component which would adversely affect the solder-wettability.

The removal of both of the inorganic composition incapable of being sintered and the Zn composition after the firing process makes it possible to reduce the glass component, found on the surface of each surface electrode, which would adversely affect the solder-wettability, and therefore, the resultant glass ceramic multi-layered substrate has an improved dimensional accuracy and also a favorable solder-wettability with respect to the surface electrodes.

BRIEF DESCRIPTION OF THE DRAWINGS

This and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

Embodiment 1

A paste of Zn composition used in the practice of a first preferred embodiment of the present invention is an inorganic composition comprising 50.0 wt % of Zn (having an average particle size of about 1.0 μm) relative to the total amount of such paste. This inorganic composition is mixed with a mill base comprising an organic binder, i.e., ethyl cellulose, added with a vehicle dissolved in terpineol and the mixture is then thoroughly mixed by the use of a roll mill to an appropriate viscosity, thereby providing the paste of Zn composition.

An electroconductive paste is an inorganic composition comprising a powder of Ag (1 μm in average particle size) added with glass frit ("GA-8" glass powder, 2.5 μm in average particle size, manufactured by Nippon Electric Glass Co., Ltd.) to give a bonding strength. This inorganic composition is mixed with a vehicle comprising ethyl cellulose (an organic binder) dissolved in terpineol and the mixture is then thoroughly mixed by the use of a roll mill to an appropriate viscosity, thereby providing the electroconductive Ag paste.

Figure 1:
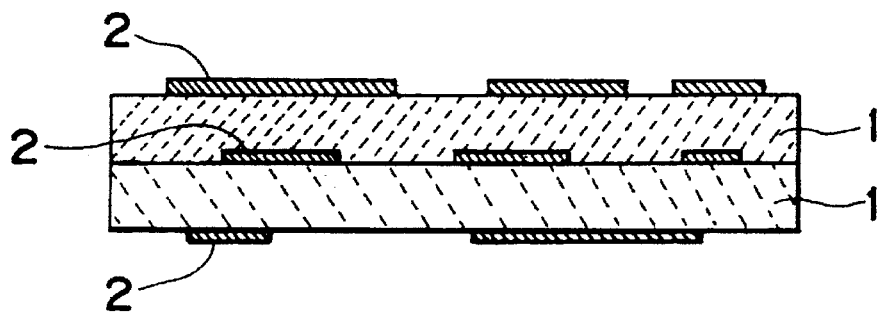
FIG. 1 is a schematic sectional view showing a laminate of two glass ceramic green sheets each having deposits of an electroconductive paste printed thereon.
Figure 2A:
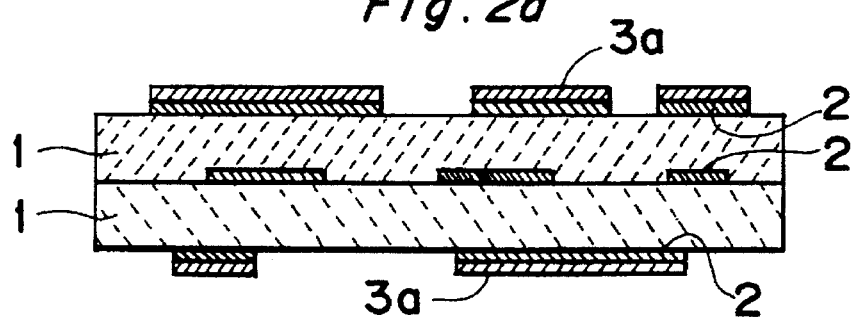
FIG. 2a is a schematic sectional view showing the laminate of FIG. 1 in which a paste of a composition comprising Zn is printed so as to deposit on the electroconductive paste deposits on one surface of the laminate.
Figure 3A:
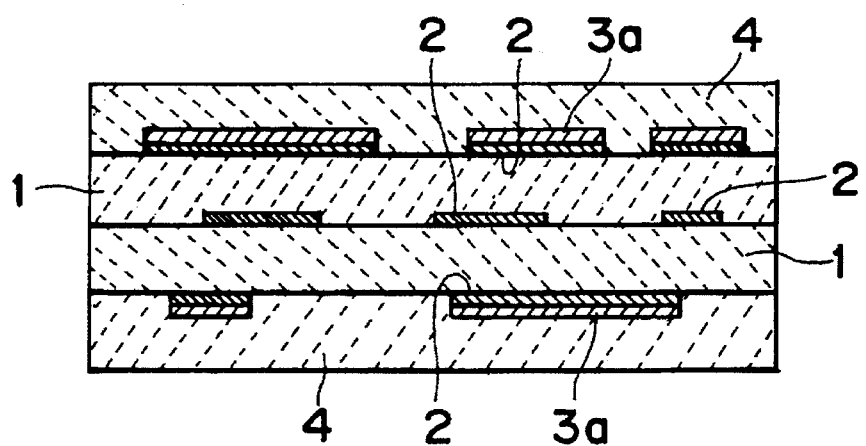
FIG. 3a is a schematic sectional view showing the laminate having its opposite surfaces deposited with respective green sheets each made of an inorganic composition which is not sintered at a temperature of crystallization of glass ceramics.

Referring now to FIG. 1, a required number of, for example, two, green sheets 1 are laminated together to provide a laminate. Prior to the lamination, the electroconductive Ag paste is applied to each of the green sheets 1 by the use of a screen printing technique to form Ag deposits 2. After the lamination, and as shown in FIG. 2a, the paste of Zn composition is applied by a screen printing technique so as to deposit on the Ag deposits 2 as shown by 3a in FIG. 2a. After the deposition of the paste of Zn composition on the Ag deposits 2 as shown by 2a, an $Al_2O_3$ green sheet 4 as a green sheet made of inorganic composition incapable of being sintered at a temperature of crystallization of glass ceramics is laminated, as shown in FIG. 3a, over each of the opposite surfaces of the laminate and is then thermally compressed to provide a laminated plate. The thermal compression is carried out at a temperature of 80° C. by the application of a pressure of 200 kg/cm².

Figure 4:
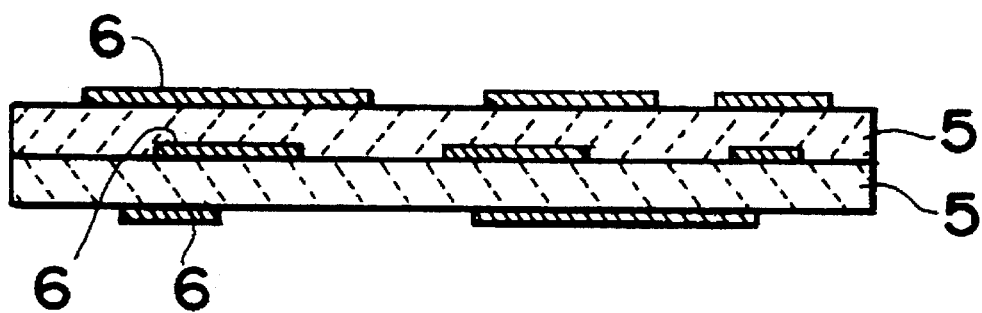
FIG. 4 is a schematic sectional view showing a glass ceramic multi-layered substrate which has been obtained by sintering the glass ceramic green sheet laminate and removing the inorganic composition not sintered and the Zn composition from the laminate.

Thereafter, the laminated plate is placed on a substrate of 96% alumina and is then fired. The firing continues at 950° C. for one hour under air in a belt furnace after the binder has been burned out at 500° C. After the firing, $Al_2O_3$ and Zn composition on each surface of the laminated plate are removed thereby completing a manufacture of a ceramic multi-layered substrate comprising the sintered glass ceramic substrate 5 and electroconductive electrodes 6 as shown in FIG. 4.

The resultant ceramic multi-layered substrate was tested to evaluate the solder-wettability by the following method.

A pattern of electroconductive films including six film pieces each 1×1 mm in size, eight film pieces each 2×2 mm in size, six round film pieces each 2 mm in diameter and two film pieces each 5×5 mm in size was printed and fired in the manner described above. A flux is applied to these electroconductive films on the substrate and the substrate was subsequently dipped for 5±0.5 seconds into a solder layer heated to 250° C. The solder-wettability was evaluated in terms of the surface area wetted with solder. In evaluating the solder-wettability, a coverage of 95% or more of the surface area by the solder deposit is considered acceptable.

As a result of the evaluation, it has been found that the Ag electrodes after having been fired were 100% wetted with solder deposits.

Embodiment 2

A paste of Zn composition used in the practice of a second preferred embodiment of the present invention is an inorganic composition comprising 85.0 wt % of ZnO (having an average particle size of about 1.5 μm) relative to the total amount of the paste. This inorganic composition is mixed with a mill base comprising an organic binder, i.e., methyl cellulose, added with a vehicle dissolved in terpineol and the mixture is then thoroughly mixed by the use of a roll mill to an appropriate viscosity, thereby providing the paste of Zn composition.

An electroconductive paste is an inorganic composition comprising a powder of CuO (5 μm in average particle size) added with glass frit ("LS-0803" glass powder, 2.0 μm in average particle size, manufactured by Nippon Electric Glass Co., Ltd.) to give bonding strength. This inorganic composition is mixed with a vehicle comprising methyl cellulose (an organic binder) dissolved in terpineol and the mixture is then thoroughly mixed by the use of a roll mill to an appropriate viscosity, thereby providing the electroconductive CuO paste.

Figure 2B:
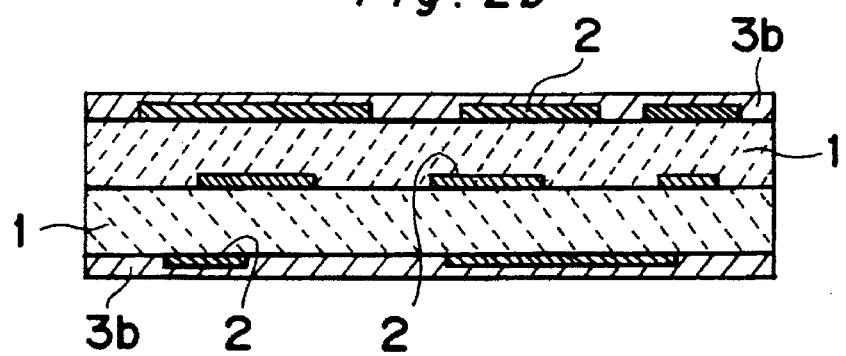
FIG. 2b is a schematic sectional view showing the laminate in which the paste of the composition comprising Zn is printed so as to deposit on each of opposite surfaces of the laminate.
Figure 3B:
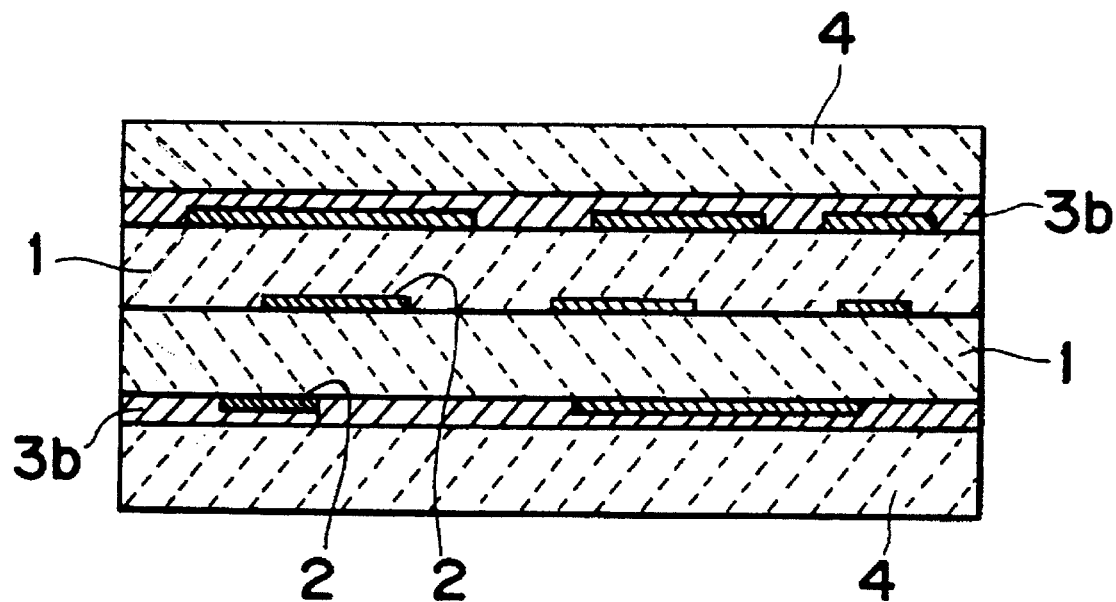
FIG. 3b is a schematic sectional view showing the laminate having its opposite surfaces deposited with respective green sheets each made of an inorganic composition which is not sintered at a temperature of crystallization of glass ceramics.

Referring now to FIG. 1, a required number of, for example, two, green sheets 1 are laminated together to provide a laminate. Prior to the lamination, the electroconductive CuO paste is applied to each of the green sheets 1 by the use of a screen printing technique to form CuO deposits 2. After the lamination, and as shown in FIG. 2b, the paste of Zn composition is applied by a screen printing technique so as to deposit on the CuO deposits 2 as shown by 3b to thereby cover entirely upper and lower surface layers of the laminate. After the deposition of the paste of Zn composition on the CuO deposits 2 as shown by 2b, a $ZrO_2$ green sheet 4 as a green sheet made of inorganic composition incapable of being sintered at a temperature of crystallization of glass ceramics is laminated, as shown in FIG. 3b, over each of the opposite surfaces of the laminate and is then thermally compressed to provide a laminated plate. The thermal compression is carried out at a temperature of 80° C. by the application of a pressure of 200 kg/cm².

Thereafter, the laminated plate is fired in a manner which will now be described. The firing process is carried out without applying a pressure to the laminated plate. This firing process starts with a burn-out of the binder. As described above, the organic binder used in association with the green sheets and the CuO paste is PVB and ethyl cellulose. Accordingly, a temperature of 500° C. or higher is sufficient for the organic binder employed to be decomposed in air and, therefore, the firing was carried out at 600° C. Thereafter, the laminated plate was reduced at 250° C. for 5 hours under an atmosphere of 100% hydrogen gas. The laminate plate is thereafter based at 950° C. in a mesh belt furnace filled with pure nitrogen. After this firing, $ZrO_2$ and Zn composition on each surface of the laminated plate are removed thereby completing a manufacture of a ceramic multi-layered substrate comprising the sintered glass ceramic substrate 5 and electroconductive electrodes 6 as shown in FIG. 4.

The resultant ceramic multi-layered substrate was tested to evaluate the solder-wettability in a manner similar to that described hereinbefore in connection with the first embodiment of the present invention. A result of this evaluation has shown that the Cu electrodes after having been fired were 100% wetted with solder deposits.

In describing the preferred embodiments of the present invention, only two amounts of Zn contained in the paste of Zn composition are herein disclosed. However, a satisfactory solder-wettability can be obtained even though the paste of Zn composition is used in a quantity not smaller than 50 wt %. Also, although reference is made only to the use of Zn and ZnO as a component used in the Zn composition, similar effects can also be obtained even when $Zn(OH)_2$, $ZnAl_2O_4$ or $ZnCO_3$ is employed.

Similarly, although the inorganic composition incapable of being sintered has been described as employed in the form of $Al_2O_3$ or $ZrO_2$, a highly precise substrate can be obtained even though MgO, $TiO_2$, BeO or BN is employed as the inorganic composition incapable of being sintered. The firing temperature suffices to be within the range of 800° to 1,000° C. in order to obtain the highly precise substrate.

Moreover, other than Ag or CuO, Ag/Pd, Ag/Pt or Cu may equally be employed as a component of the electroconductive paste to obtain the highly precise substrate.

As hereinbefore fully described, according to the present invention, during the manufacture of the multi-layered ceramic substrate in which no shrinkage in the planar direction take place, the paste of the Zn composition is printed on the deposits of the electrode paste printed on a surface layer so that, when and after the substrate and the conductors on the surface layer have been co-fired, the electrodes on the surface layer can exhibit a superior solder-wettability, say, 100% wettability. Thus, the present invention is effective to provide a highly precise ceramic multi-layered substrate capable of exhibiting a solder-wettability comparable to that exhibited by the currently employed ceramic multi-layered substrate in which the surface conductors are fired after the baking of the substrate.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A method of making a multi-layered ceramic substrate which comprises the steps of:

laminating a desired number of green sheets to provide a green sheet laminate, each of said green sheets being made of glass ceramics containing at least an organic binder and a solvent, each of said green sheets having a pattern of electrodes formed thereon by the use of an electroconductive paste which contains an inorganic composition including particles capable of forming said electrodes upon firing, glass and at least a binder and a solvent, printing, on the electrodes on opposite surfaces of the green sheet laminate or an entire surface layer of the green sheet laminate, a paste comprising a Zn composition and at least an organic binder and a solvent, with said Zn composition dispersed in said paste;

laminating, on each surface of the laminate printed with the Zn-composition containing paste, a green sheet made of an inorganic composition incapable of being sintered at a temperature of crystallization of the glass ceramics, thereby providing a laminate plate;

firing the resultant laminate plate; and removing both the inorganic composition incapable of being sintered and the Zn composition from the opposite surfaces of the laminate, whereby Si contained in said glass of said electroconductive paste crystallizes with Zn in said Zn composition, resulting in removal of glass from said electrode with improved solder wettability of said electrode.

2. The substrate making method as claimed in claim 1, wherein the amount of Zn contained in the paste of the Zn composition is not smaller than 50 wt % relative to the total amount of the paste.

3. The substrate making method as claimed in claim 1, wherein the paste of the Zn composition contains a main component selected from the group consisting of Zn, ZnO, $Zn(OH)_2$, $ZnAl_2O_4$, and ZnO.

4. The substrate making method as claimed in claim 1, wherein the firing is carried out at a temperature within the range of 800° to 1,000° C.

5. The substrate making method as claimed in claim 1, wherein the green sheet made of the inorganic composition, incapable of being sintered during the firing step contains at least one selected from the group consisting of $AL_2O_3$, MgO, $ZrO_2$, $TiO_2$, BeO and BN.

6. The substrate making method as claimed in claim 1, wherein the electroconductive paste contains a main component selected from the group consisting of Ag, Ag/Pd, Ag/Pt and Cu.

7. A method of making a multi-layered ceramic substrate which comprises the steps of:

laminating a desired number of green sheets to provide a green sheet laminate, each of said green sheets being made of glass ceramics containing at least an organic binder and a solvent, each of said green sheets having a pattern of electrodes formed thereon by the use of an electroconductive paste which contains an inorganic composition including particles containing cupric oxide (CuO), glass, at least a binder and a solvent, printing, on the electrodes on opposite surfaces of the green sheet laminate or an entire surface layer of the green sheet laminate, a paste comprising a Zn composition and at least an organic binder and a solvent;

laminating, on each surface of the laminate printed with the Zn-composition containing paste, a green sheet made of an of inorganic composition incapable of being sintered at a temperature of crystallization of the glass ceramics, thereby providing a laminate plate;

heat-treating the laminate plate under air at a temperature sufficient to evaporate and disperse the organic binder contained inside the laminate plate;

reducing the heat-treated laminate plate under an atmosphere comprising a gaseous medium of hydrogen or a mixture of hydrogen and nitrogen;

sintering the reduced laminate plate under an atmosphere comprising a nitrogen gas; and removing both the inorganic composition incapable of being sintered and the Zn composition from the opposite surfaces of the laminate, whereby Si contained in said glass of said electroconductive paste crystallizes with Zn in said Zn composition, resulting in removal of glass from said electrode with improved solder wettability of said electrode.

8. The substrate making method as claimed in claim 7, wherein the amount of Zn contained in the paste of the Zn composition is not smaller than 50 wt % relative to the total amount of the paste.

9. The substrate making method as claimed in claim 7, wherein the paste of the Zn composition contains a main component selected from the group consisting of Zn, ZnO, $Zn(OH)_2$, $ZnAl_2O_4$, and $ZnCO_3$.

10. The substrate making method as claimed in claim 7, wherein the firing is carried out at a temperature within the range of 800° to 1,000° C.

11. The substrate making method as claimed in claim 7, wherein the green sheet made of the inorganic composition incapable of being sintered during the firing step contains at least one selected from the group consisting of $Al_2O_3$, MgO, $ZrO_2$, $TiO_2$, BeO and BN.

* * * * *